US011170998B2

United States Patent
Sun et al.

(10) Patent No.: US 11,170,998 B2
(45) Date of Patent: Nov. 9, 2021

(54) METHOD AND APPARATUS FOR DEPOSITING A METAL CONTAINING LAYER ON A SUBSTRATE

(71) Applicant: Applied Materials, Inc., Santa Clara, CA (US)

(72) Inventors: Lizhong Sun, San Jose, CA (US); Xiaodong Yang, Xi'an (CN); Mark Covington, Santa Clara, CA (US); Vivek Vinit, Bangalore (IN); Vishal Agrawal, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 24 days.

(21) Appl. No.: 16/811,901

(22) Filed: Mar. 6, 2020

(65) Prior Publication Data
US 2020/0335332 A1 Oct. 22, 2020

(30) Foreign Application Priority Data
Apr. 19, 2019 (WO) ................ PCT/CN2019/083508

(51) Int. Cl.
*H01L 21/02* (2006.01)
*H01L 21/768* (2006.01)

(52) U.S. Cl.
CPC .... *H01L 21/02293* (2013.01); *H01L 21/0243* (2013.01); *H01L 21/0245* (2013.01); *H01L 21/76879* (2013.01)

(58) Field of Classification Search
CPC .......... H01L 21/02293; H01L 21/0243; H01L 21/76879; H01L 21/0245
See application file for complete search history.

(56) References Cited

U.S. PATENT DOCUMENTS

| 6,605,195 | B2 | 8/2003 | McLeod |
| 9,620,356 | B1 | 4/2017 | Bashyam et al. |
| 2011/0159200 | A1 | 6/2011 | Kogure |
| 2012/0052683 | A1 | 3/2012 | Kim et al. |

(Continued)

FOREIGN PATENT DOCUMENTS

| CN | 103403215 A | 11/2013 |
| CN | 103820763 A | 5/2014 |

(Continued)

OTHER PUBLICATIONS

PCT Notification of Transmittal of the International Search Report and the Written Opinion of the International Searching Authority for International Application No. PCT/CN2019/083508; dated Jan. 23, 2020; 11 total pages.

*Primary Examiner* — Quoc D Hoang
(74) *Attorney, Agent, or Firm* — Patterson + Sheridan, LLP

(57) ABSTRACT

The present disclosure provides methods for forming a metal containing material onto a substrate with good film uniformity and stress profile across the substrate. In one embodiment, a method of sputter depositing a metal containing layer on a substrate includes supplying a gas mixture into a processing chamber, forming a first portion of a metal containing layer on a substrate, transferring the substrate from the processing chamber, rotating the substrate, transferring the substrate back to the processing chamber, and forming a second portion of the metal containing layer on the first portion of the metal containing layer.

20 Claims, 4 Drawing Sheets

(56) References Cited

U.S. PATENT DOCUMENTS

| | | | |
|---|---|---|---|
| 2012/0276711 A1 | 11/2012 | Yoon et al. | |
| 2012/0309194 A1 | 12/2012 | Xu et al. | |
| 2013/0109144 A1 | 5/2013 | Kim et al. | |
| 2013/0122699 A1 | 5/2013 | Wang | |
| 2015/0052702 A1* | 2/2015 | Dobashi | H01L 21/02057 15/303 |
| 2015/0293363 A1 | 10/2015 | Diehl et al. | |

FOREIGN PATENT DOCUMENTS

| | | |
|---|---|---|
| CN | 206616268 U | 11/2017 |
| JP | 2000269568 A | 9/2000 |

\* cited by examiner

SUBSTRATE 101

SUBSTRATE 101

METHOD AND APPARATUS FOR DEPOSITING A METAL CONTAINING LAYER ON A SUBSTRATE

CROSS-REFERENCE TO RELATED APPLICATIONS

This application claims benefit of PCT International Application No. PCT/CN2019/083716, filed Apr. 22, 2019, all of which is incorporated by reference in its entirety.

BACKGROUND OF THE DISCLOSURE

Field of the Disclosure

Embodiments of the disclosure generally relate to a fabrication process for forming a metal containing material on a substrate, and more particularly, for forming a metal containing material with desired film and stress uniformity across the substrate for semiconductor manufacturing applications.

Description of the Background Art

Reliably producing submicron and smaller features is one of the key technologies for the next generation of very large scale integration (VLSI) and ultra large scale integration (ULSI) of semiconductor devices. However, as the miniaturization of circuit technology is pressed, the shrinking dimensions of interconnects in VLSI and ULSI technology have placed additional demands on the processing capabilities. The multilevel interconnects that lie at the heart of this technology require precise processing of high aspect ratio features, such as vias and other interconnects. Reliable formation of these interconnects is very important to VLSI and ULSI success and to the continued effort to increase circuit density and quality of individual substrates.

As circuit densities increase for next generation devices, the widths of interconnects, such as vias, trenches, contacts, gate structures and other features, as well as the dielectric materials therebetween, decrease to 45 nm and 32 nm dimensions, whereas the thickness of the dielectric layers remain substantially constant, with the result of increasing the aspect ratios of the features.

With the shrink of critical dimensions (CD), thickness variation across the substrate surface is required to be minimal in order to reliably produce devices with minimal feature sizes, such as a width of a control gate in a device. Three dimensional (3D) stacking of semiconductor memory chips, such as magnetoresistive random access memory (MRAM) or other memory devices, is often utilized to improve performance of the transistors. By arranging transistors in three dimensions instead of conventional two dimensions, multiple transistors may be placed in the integrated circuits (ICs) very close to each other.

Furthermore, many types of micro-electromechanical devices, such as Micro Electro-Mechanical Systems (MEMS), as well as filter devices are also widely used in electric device manufacturing industries. Different types of metal containing materials are often used when fabricating the MEMS and filter devices.

In the manufacture of micro electro-mechanical systems (MEMS) as well as other suitable devices, a metal containing layer, such as doped or undoped aluminum nitride, lead zirconate titanate (PZT), or lead free ceramics (e.g., (K,Na)NbO$_3$ (KNN)), is often used as an active layer disposed under the multiple layer structures.

Physical vapor deposition (PVD) process, also known as sputtering process, is an important method of forming the metal containing materials or metallic features in integrated circuits. Sputtering deposits a material layer, often a metal containing material, on a substrate. A source material, such as a target, is bombarded by ions strongly accelerated by an electric field. The bombardment ejects material from the target, and the material then deposits on the substrate.

With the push to shrink the critical dimensions (CD) of semiconductor devices and the property uniformity of piezoelectric materials formed on the substrate, film stress/strain variations in the critical layers of the device structure must be minimized or eliminated in order to reliably produce devices that are nanometers in size. Furthermore, the requirement for the uniform bonding and/or lattice structure of the film material across the substrate has become increasingly challenging so as to meet high density device performance standard.

Therefore, there is a need for an improved method of forming a metal containing layer with good uniformity, desired stress control and distribution, and a desired surface morphology with desired film properties.

SUMMARY OF THE DISCLOSURE

The present disclosure provides methods for forming a metal containing material onto a substrate with good film uniformity and stress profile across the substrate. In one embodiment, a method of sputter depositing a metal containing layer on the substrate includes supplying a gas mixture into a processing chamber, forming a first portion of a metal containing layer on a substrate, transferring the substrate from the processing chamber, rotating the substrate, transferring the substrate back to the processing chamber, and forming a second portion of the metal containing layer on the first portion of the metal containing layer.

In another embodiment, a cluster system includes a physical vapor deposition chamber, a transfer chamber attached to the physical vapor deposition chamber, a robot disposed in the transfer chamber, and an orientation chamber, wherein the robot in the transfer chamber is configured to transfer a substrate between the physical vapor deposition chamber and the orientation chamber for substrate rotation.

In yet another embodiment, a computer readable storage medium storing a program, which, when executed by a processor performs an operation for operating a processing chamber, the operation includes performing a deposition process in a processing chamber to form a first portion of a metal containing layer on a substrate, removing the substrate from the processing chamber, rotating the substrate, and transferring the substrate back in the processing chamber to deposit a second portion of the metal containing layer.

BRIEF DESCRIPTION OF THE DRAWINGS

So that the manner in which the above recited features of the present disclosure are attained and can be understood in detail, a more particular description of the disclosure, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

The present disclosure provides methods for depositing a metal containing layer onto a substrate having a desired film uniformity, stress distribution and film properties. The deposition process may be a sputtering deposition process, e.g., a physical vapor deposition process. During deposition of the metal containing layer, the substrate may be rotated, in-situ or ex-situ, in the physical vapor deposition processing chamber. While rotating the substrate, one or more additional surface treatment processes, such as a heating, cooling, and/or a surface treatment process, may be performed so as to alter the film properties, such as film uniformity, film stress, lattice structures and the like, to obtain desired film properties that enable meeting device performance requirements. In one example, rotation of the substrate may be performed in the processing chamber where the deposition process is performed. In another example, rotation of the substrate may be performed in a different chamber, such as an orientation chamber, or other suitable chamber, incorporated in a cluster tool that also includes the deposition processing chamber in which the metal containing layer was deposited.

Figure 1:
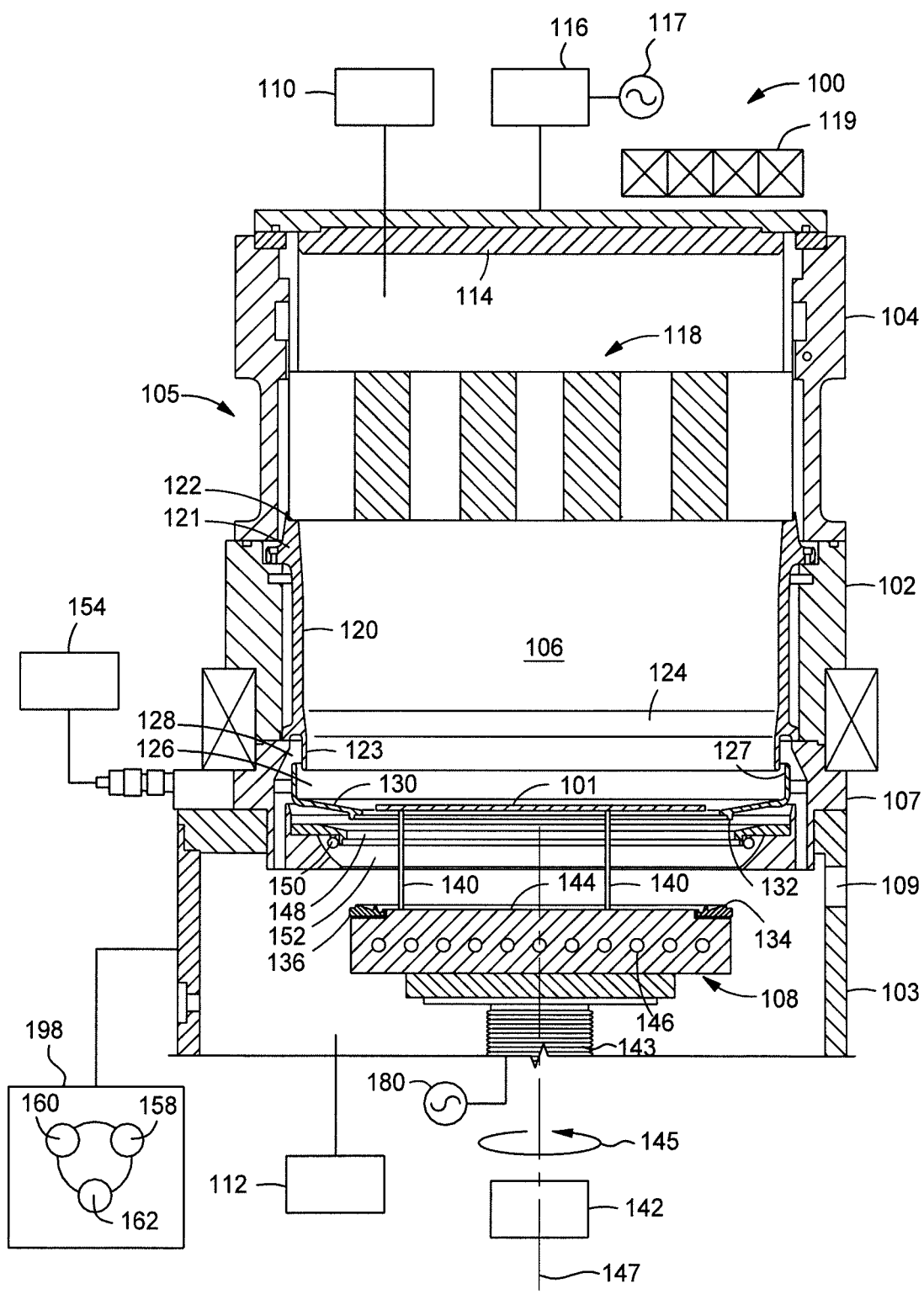
FIG. 1 depicts a schematic cross-sectional view of one embodiment of a process chamber in accordance with one embodiment of the present disclosure.

FIG. 1 illustrates an exemplary physical vapor deposition (PVD) chamber 100 (e.g., a sputter process chamber) suitable for sputter depositing materials according to one embodiment of the disclosure. Examples of suitable PVD chambers include the ALPS® Plus and SIP ENCORE® PVD processing chambers, both commercially available from Applied Materials, Inc., Santa Clara, of California. It is contemplated that processing chambers available from other manufactures may also be adapted to perform the embodiments described herein.

FIG. 1 is a schematic cross-sectional view of a deposition chamber 100 according to one embodiment. The deposition chamber 100 has an upper sidewall 102, a lower sidewall 103, and a lid portion 104 defining a body 105 that encloses an interior volume 106 thereof. An adapter plate 107 may be disposed between the upper sidewall 102 and the lower sidewall 103.

A substrate support, such as a pedestal 108, is disposed in the interior volume 106 of the deposition chamber 100. The pedestal 108 may be rotatable, as indicated by the arrow 145, along an axis 147, where a shaft 143 of the pedestal 108 is located. Alternatively, the pedestal 108 may be lifted up to rotate as necessary during a deposition process.

A substrate transfer port 109 is formed in the lower sidewall 103 for transferring substrates into and out of the interior volume 106.

In one embodiment, the deposition chamber 100 includes a sputtering chamber, also known as a physical vapor deposition (PVD) chamber, capable of depositing, for example, titanium, aluminum oxide, aluminum, aluminum nitride, scandium doped aluminum nitride, aluminum oxynitride, lead zirconate titanate (PZT), potassium sodium niobate (KNN), lithium niobate, copper, tantalum, tantalum nitride, tantalum oxynitride, titanium oxynitride, tungsten, or tungsten nitride on a substrate, such as the substrate 101.

A gas source 110 is coupled to the deposition chamber 100 to supply process gases into the interior volume 106. In one embodiment, process gases may include inert gases, non-reactive gases, and reactive gases if necessary. Examples of process gases that may be provided by the gas source 110 include, but not limited to, argon gas (Ar), helium (He), neon gas (Ne), nitrogen gas ($N_2$) and oxygen gas ($O_2$), among others.

A pumping device 112 is coupled to the deposition chamber 100 in communication with the interior volume 106 to control the pressure of the interior volume 106. In one embodiment, the pressure level of the deposition chamber 100 may be maintained at about 1 Torr or less. In another embodiment, the pressure level of the deposition chamber 100 may be maintained at about 500 milliTorr or less. In yet another embodiment, the pressure level of the deposition chamber 100 may be maintained at about 1 milliTorr and about 300 milliTorr.

The lid portion 104 may support a sputtering source 114, such as a target. In one embodiment, the sputtering source 114 may be fabricated from a material containing titanium (Ti) metal, tantalum metal (Ta), tungsten (W) metal, cobalt (Co), nickel (Ni), copper (Cu), aluminum (Al), zirconium (Zr), niobium (Nb), scandium (Sc), alloys thereof, combinations thereof, or the like. In an exemplary embodiment depicted herein, the sputtering source 114 may be fabricated by titanium (Ti) metal, tantalum metal (Ta) or aluminum (Al).

The sputtering source 114 may be coupled to a source assembly 116 includes a power supply 117 for the sputtering source 114. A set of magnet 119 may be coupled adjacent to the sputtering source 114 which enhances efficient sputtering materials from the sputtering source 114 during processing. Examples of the magnetron assembly include an electromagnetic linear magnetron, a serpentine magnetron, a spiral magnetron, a double-digitated magnetron, a rectangularized spiral magnetron, among others.

An additional RF power source 180 may also be coupled to the deposition chamber 100 through the pedestal 108 (or called substrate support) to provide a bias power between the sputtering source 114 and the pedestal 108 as needed. In one embodiment, the RF power source 180 may have a frequency between about 1 MHz and about 100 MHz, such as about 13.56 MHz.

A collimator 118 may be positioned in the interior volume 106 between the sputtering source 114 and the pedestal 108. A shield tube 120 may be in proximity to the collimator 118 and interior of the lid portion 104. The collimator 118 includes a plurality of apertures to direct gas and/or material flux within the interior volume 106. The collimator 118 may be mechanically and electrically coupled to the shield tube 120. In one embodiment, the collimator 118 is mechanically coupled to the shield tube 120, such as by a welding process, making the collimator 118 integral to the shield tube 120. In another embodiment, the collimator 118 may be electrically floating within the processing chamber 100. In another embodiment, the collimator 118 may be coupled to an electrical power source and/or electrically coupled to the lid portion 104 of the body 105 of the deposition chamber 100.

The shield tube 120 may include a tubular body 121 having a recess 122 formed in an upper surface thereof. The recess 122 provides a mating interface with a lower surface of the collimator 118. The tubular body 121 of the shield tube 120 may include a shoulder region 123 having an inner diameter that is less than the inner diameter of the remainder of the tubular body 121. In one embodiment, the inner surface of the tubular body 121 transitions radially inward along a tapered surface 124 to an inner surface of the shoulder region 123. A shield ring 126 may be disposed in the processing chamber 100 adjacent to the shield tube 120 and intermediate of the shield tube 120 and the adapter plate 107. The shield ring 126 may be at least partially disposed in a recess 128 formed by an opposing side of the shoulder region 123 of the shield tube 120 and an interior sidewall of the adapter plate 107.

In one aspect, the shield ring 126 includes an axially projecting annular sidewall 127 that includes an inner diameter that is greater than an outer diameter of the shoulder region 123 of the shield tube 120. A radial flange 130 extends from the annular sidewall 127. The radial flange 130 may be formed at an angle greater than about ninety degrees (90°) relative to the inside diameter surface of the annular sidewall 127 of the shield ring 126. The radial flange 130 includes a protrusion 132 formed on a lower surface thereof. The protrusion 132 may be a circular ridge extending from the surface of the radial flange 130 in an orientation that is substantially parallel to the inside diameter surface of the annular sidewall 127 of the shield ring 126. The protrusion 132 is adapted to mate with a recessed flange 134 formed in an edge ring 136 disposed on the pedestal 108. The recessed flange 134 may be a circular groove formed in the edge ring 136. The engagement of the protrusion 132 and the recessed flange 134 centers the shield ring 126 with respect to the longitudinal axis of the pedestal 108. The substrate 101 (shown supported on lift pins 140) is centered relative to the longitudinal axis of the pedestal 108 by coordinated positioning calibration between the pedestal 108 and a robot blade (not shown). In this manner, the substrate 101 may be centered within the processing chamber 100 and the shield ring 126 may be centered radially about the substrate 101 during processing.

In operation, a robot blade (not shown) having a substrate 101 thereon is extended through the substrate transfer port 109. The pedestal 108 may be lowered to allow the substrate 101 to be transferred to the lift pins 140 extending from the pedestal 108. Lifting and lowering of the pedestal 108 and/or the lift pins 140 may be controlled by a drive 142 coupled to the pedestal 108. The substrate 101 may be lowered onto a substrate receiving surface 144 of the pedestal 108. With the substrate 101 positioned on the substrate receiving surface 144 of the pedestal 108, sputter depositions may be performed on the substrate 101. The edge ring 136 may be electrically insulated from the substrate 101 during processing. Therefore, the substrate receiving surface 144 may include a height that is greater than a height of portions of the edge ring 136 adjacent the substrate 101 such that the substrate 101 is prevented from contacting the edge ring 136. During sputter deposition, the temperature of the substrate 101 may be controlled by utilizing thermal control channels 146 disposed in the pedestal 108.

After sputter deposition, the substrate 101 may be elevated utilizing the lift pins 140 to a position that is spaced away from the pedestal 108. The elevated location may be proximate one or both of the shield ring 126 and a reflector ring 148 adjacent to the adapter plate 107. The adapter plate 107 includes one or more lamps 150 coupled thereto intermediate of a lower surface of the reflector ring 148 and a concave surface 152 of the adapter plate 107. The lamps 150 provide optical and/or radiant energy in the visible or near visible wavelengths, such as in the infra-red (IR) and/or ultraviolet (UV) spectrum. The energy from the lamps 150 is focused radially inward toward the backside (i.e., lower surface) of the substrate 101 to heat the substrate 101 and the material deposited thereon. Reflective surfaces on the chamber components surrounding the substrate 101 serve to focus the energy toward the backside of the substrate 101 and away from other chamber components where the energy would be lost and/or not utilized. The adapter plate 107 may be coupled to a coolant source 154 to control the temperature of the adapter plate 107 during heating.

After controlling the substrate 101 to the desired temperature, the substrate 101 is lowered to a position on the substrate receiving surface 144 of the pedestal 108. The substrate 101 may be rapidly cooled utilizing the thermal control channels 146 in the pedestal 108 via conduction. The temperature of the substrate 101 may be ramped down from the first temperature to a second temperature in a matter of seconds to about a minute. The substrate 101 may be removed from the processing chamber 100 through the substrate transfer port 109 for further processing. The substrate 101 may be maintained at a desired temperature range, such as less than 250 degrees Celsius as needed.

A controller 198 is coupled to the process chamber 100. The controller 198 includes a central processing unit (CPU) 160, a memory 158, and support circuits 162. The controller 198 is utilized to control the process sequence, regulating the gas flows from the gas source 110 into the processing chamber 100 and controlling ion bombardment of the sputtering source 114. The CPU 160 may be of any form of a general purpose computer processor that can be used in an industrial setting. The software routines can be stored in the memory 158, such as random access memory, read only memory, floppy or hard disk drive, or other form of digital storage. The support circuits 162 are conventionally coupled to the CPU 160 and may include cache, clock circuits, input/output subsystems, power supplies, and the like. The software routines, when executed by the CPU 160, transform the CPU into a specific purpose computer (controller) 198 that controls the processing chamber 100 such that the processes are performed in accordance with the present disclosure. The software routines may also be stored and/or executed by a second controller (not shown) that is located remotely from the processing chamber 100.

During processing, material is sputtered from the sputtering source 114 and deposited on the surface of the substrate 101. The sputtering source 114 and the pedestal 108 are biased relative to each other by the power supply 117 or 180 to maintain a plasma formed from the process gases supplied by the gas source 110. The ions from the plasma are accelerated toward and strike the sputtering source 114, causing target material to be dislodged from the sputtering source 114. The dislodged target material and process gases form a metal containing layer on the substrate 101 with a desired composition.

Figure 2:
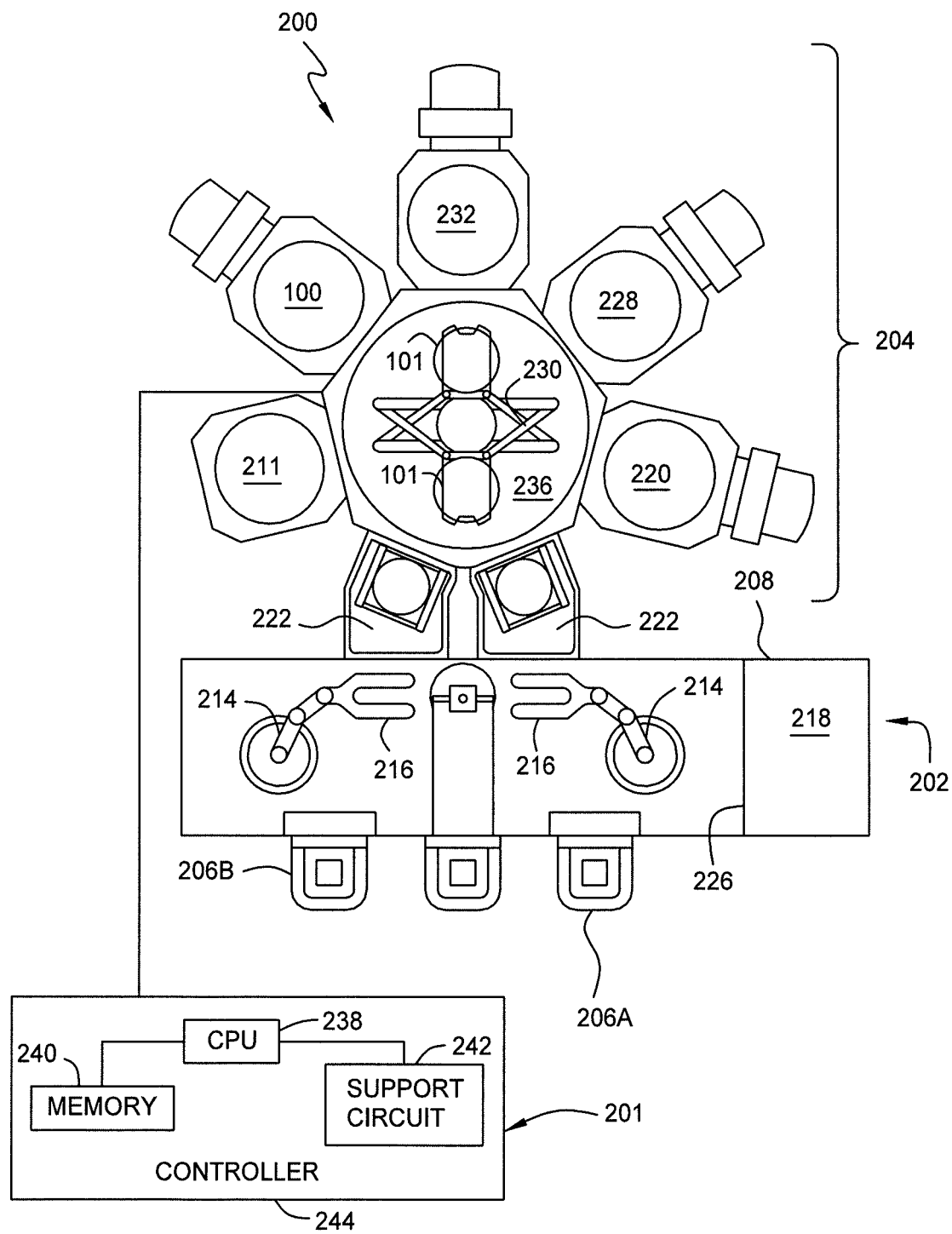
FIG. 2 depicts a cluster tool that includes at least the process chamber of FIG. 1 in accordance with one embodiment of the present disclosure.

FIG. 2 is a schematic, top plan view of an exemplary cluster processing system 200 that includes one or more of the processing chambers 211, 100, 232, 228, 220 that are incorporated and integrated therein. In one embodiment, the cluster processing system 200 may be a Centura® or Endura® integrated processing system, commercially available from Applied Materials, Inc., located in Santa Clara, Calif. It is contemplated that other processing systems (including those from other manufacturers) may be adapted to benefit from the disclosure.

The cluster processing system 200 includes a vacuum-tight processing platform 204, a factory interface 202, and a system controller 244. The platform 204 includes a plurality of processing chambers 211, 100, 232, 228, 220 and at least one load lock chamber 222 that is coupled to a vacuum substrate transfer chamber 236. Two load lock chambers 222 are shown in FIG. 2. The factory interface 202 is coupled to the transfer chamber 236 by the load lock chambers 222.

In one embodiment, the factory interface 202 includes at least one docking station 208 and at least one factory interface robot 214 to facilitate transfer of substrates. The docking station 208 is configured to accept one or more front opening unified pod (FOUP). Two FOUPS 206A-B are shown in the embodiment of FIG. 2. The factory interface robot 214 having a blade 216 disposed on one end of the factory interface robot 214 is configured to transfer the substrate from the factory interface 202 to the platform 204 for processing through the load lock chambers 222. Optionally, one or more metrology stations 218 may be connected to a terminal 226 of the factory interface 202 to facilitate measurement of the substrate from the FOUPS 206A-B.

Each of the load lock chambers 222 have a first port coupled to the factory interface 202 and a second port coupled to the transfer chamber 236. The load lock chambers 222 are coupled to a pressure control system (not shown) which pumps down and vents the load lock chambers 222 to facilitate passing the substrate between the vacuum environment of the transfer chamber 236 and the substantially ambient (e.g., atmospheric) environment of the factory interface 202.

The transfer chamber 236 has a vacuum robot 230 disposed therein. The vacuum robot 230 has a blade 234 capable of transferring substrates 101 among the load lock chambers 222, the metrology system 210 and the processing chambers 211, 100, 232, 228, 220.

In one embodiment of the cluster processing system 200, the cluster processing system 200 may include one or more processing chambers 211, 100, 232, 228, 220, which may be a processing chamber (e.g., physical vapor processing chamber, chemical vapor deposition, or other processing chambers), annealing chamber (e.g., high pressure annealing chamber, RTP chamber, laser anneal chamber), a treatment chamber that can heat or cool the substrate, etch chamber, orientation chamber that can rotate the substrate, a cleaning chamber, curing chamber, lithographic exposure chamber, or other similar type of semiconductor processing chambers. In some embodiments of the cluster processing system 200, the cluster processing system 200 may include one or more of processing chambers 211, 100, 232, 228, 220, the transfer chamber 236, the factory interface 202 and/or at least one of the load lock chambers 222. In one example, the processing chambers 211, 100, 232, 228, 220 in the cluster processing system 200 includes at least one physical vapor processing chamber and one substrate orientation chamber.

The system controller 244 is coupled to the cluster processing system 200. The system controller 244, which may include the computing device 201 or be included within the computing device 201, controls the operation of the cluster processing system 200 using a direct control of the process chambers 211, 100, 232, 228, 220 of the cluster processing system 200. Alternatively, the system controller 244 may control the computers (or controllers) associated with the process chambers 211, 100, 232, 228, 220 and the cluster processing system 200. In operation, the system controller 244 also enables data collection and feedback from the respective chambers to optimize performance of the cluster processing system 200.

The system controller 244, much like the computing device 201 described above, includes a central processing unit (CPU) 238, a memory 240, and support circuits 242. The CPU 238 may be one of any form of a general purpose computer processor that can be used in an industrial setting. The support circuits 242 are conventionally coupled to the CPU 238 and may include cache, clock circuits, input/output subsystems, power supplies, and the like. The software routines transform the CPU 238 into a specific purpose computer (controller) 244. The software routines may also be stored and/or executed by a second controller (not shown) that is located remotely from the cluster processing system 200.

Figure 3:
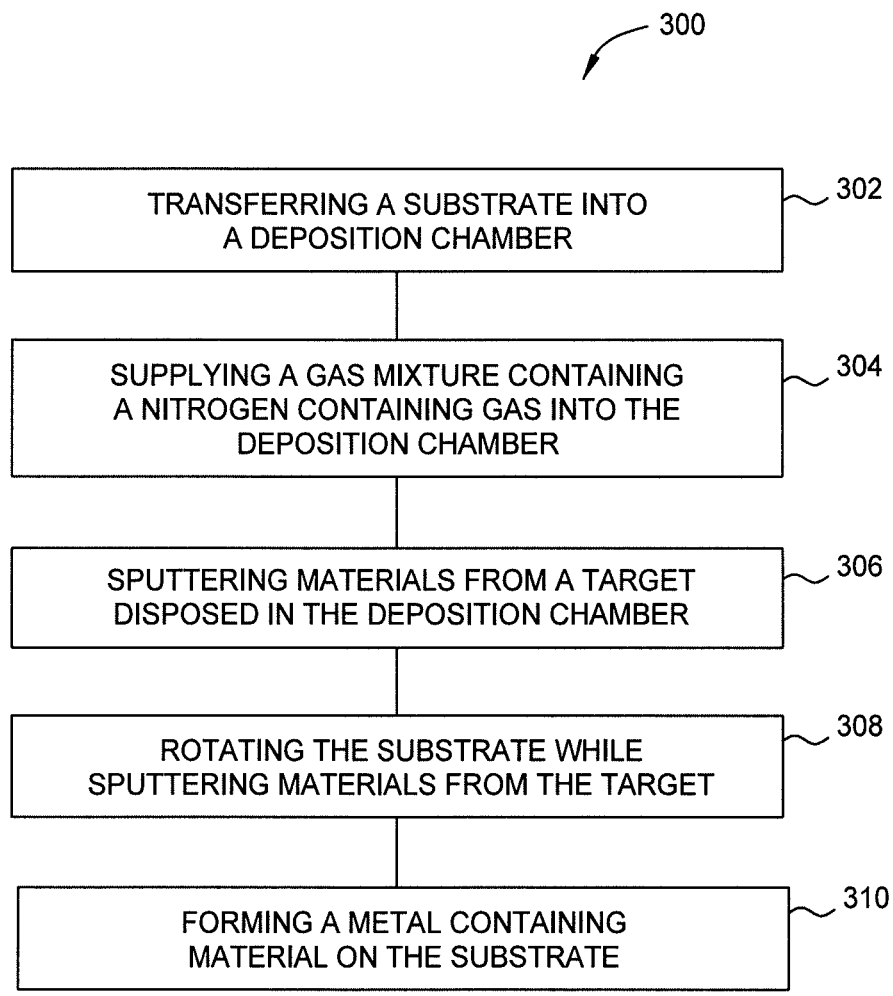
FIG. 3 depicts a process flow diagram for depositing a metal containing layer in accordance with one embodiment of the present disclosure.
Figure 4A:
FIG. 4A-4B depicts an exemplary cross sectional view of a metal containing material formed on a substrate at different manufacture stage in accordance with one embodiment of the present disclosure.
Figure 4B:
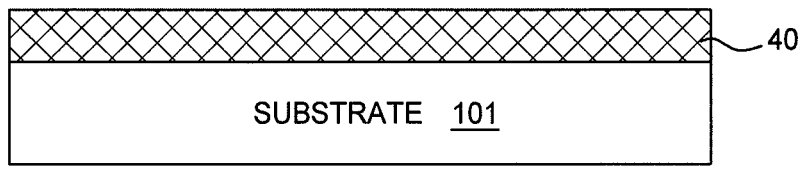

FIG. 3 is a flow diagram of a process 300 for forming a metal containing layer onto a substrate surface. FIGS. 4A-4B depict schematic cross-sectional views of an exemplary application sequence of a metal containing layer 402 formed on the substrate 101 by utilizing the process 300. It is noted that the metal containing layer may be utilized in any suitable structures, such as a contact structure, a back end structure, a front end structure and the like, as needed.

The process 300 starts at operation 302 by transferring the substrate 101 formed thereon into a process chamber, such as the processing chamber 100, as depicted in FIG. 1. "Substrate" or "substrate surface," as used herein, refers to any substrate or material surface formed on a substrate upon which film processing is performed. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, quartz, and any other materials such as metals, metal nitrides, metal alloys, and other conductive materials, depending on the application. Barrier layers, metals or metal nitrides on a substrate surface may include titanium, titanium nitride, titanium silicide nitride, tungsten, tungsten nitride, tungsten silicide nitride, tantalum, tantalum nitride, or tantalum silicide nitride. Substrates may have various dimensions, such as 200 mm, 300 mm or 450 mm diameter wafers, as well as, rectangular or square panes. Substrates include semiconductor substrates, display substrates (e.g., LCD), solar panel substrates, and other types of substrates. Unless otherwise noted, embodiments and examples described herein are conducted on substrates with a 200 mm diameter, a 300 mm diameter or a 450 mm diameter. Processes of the embodiments described herein may be used to form or deposit titanium nitride materials on many substrates and surfaces. Substrates on which embodiments of the disclosure may be useful include, but are not limited to semiconductor wafers, such as crystalline silicon (e.g., Si<100> or Si<111>), silicon oxide, glass, quartz, strained silicon, silicon germanium, doped or undoped polysilicon, doped or undoped silicon wafers and patterned or non-patterned wafers. Substrates may be exposed to a pretreatment process to polish, etch, reduce, oxidize, hydrogenate, anneal and/or bake the substrate surface.

At operation 304, a gas mixture is supplied to the processing chamber 100 for forming a metal containing layer 402 onto the substrate 101, as shown in FIG. 4B. Suitable examples of the metal containing layer 402 includes AlON, AlN or AlO, ScAlN, lead zirconate titanate, lithium niobate and potassium sodium niobate. In one embodiment, the gas mixture may include reactive gas, non-reactive gas, inert gas, and the like. Examples of reactive and non-reactive gas include, but not limited to, $O_2$, $N_2$, $N_2O$, $NO_2$, $NH_3$, and $H_2O$, among others. Examples of inert gas include, but not limited to, Ar, Ne, He, Xe, and Kr, among others. In one particular embodiment depicted herein, the gas mixture supplied to the process chamber includes at least one nitrogen containing gas, an oxygen containing gas and optionally an inert gas.

In one embodiment, the gas mixture supplied to the processing chamber 100 for deposition of the metal containing layer 402 includes at least an oxygen containing gas, such as $O_2$, $H_2O$, $NO_2$ or $N_2O$, and/or a nitrogen containing gas, such as $N_2$, $NO_2$, $N_2O$, $NH_3$, and the like. In one example, the gas mixture supplied to the processing chamber 100 for deposition of the metal containing layer 402 includes a $O_2$ gas and/or a $N_2$ gas. During processing, a metal alloy target is utilized as the sputtering source 114. For example, a metal alloy target made from an aluminum (Al) containing alloy may be utilized as a source material for the sputtering source 114 for sputter process. It is noted that the aluminum (Al) containing target as described here is only for illustration propose and should not be construed as limiting the scope of the disclosure. Furthermore, the metal alloy target that may be utilized as the sputtering source 114 may be made by a material from a group consisting of Al, Cu, Ti, Ta, W, Co, Cr, Ni, Sc, Nb, Zr, alloys thereof, combinations thereof and the like.

In one embodiment, the gas mixture supplied into the process chamber 100 includes a $N_2$ gas and/or an $O_2$ gas. The $N_2$ and $O_2$ gas may be supplied at a flow rate between about 1 sccm and about 1000 sccm. In the embodiment wherein an inert gas, such as He or Ar, is utilized, the inert gas may be supplied in the gas mixture at a flow rate between about 1 sccm and about 1000 sccm.

In one embodiment, the $N_2$ gas and/or the $O_2$ gas supplied in the gas mixture may be regulated at a predetermined ratio to form the metal containing layer 402, such as a AlON layer, AlN or AlO layer, when the sputtering source 114 utilized here is an aluminum target. Under the predetermined ratio of the $N_2$ gas (or $O_2$ gas or both) supplied in the gas mixture, a predetermined stoichiometric ratio of nitrogen or oxygen may be formed in the resultant AlN or AlO layer.

At operation 306, after the gas mixture is supplied into the processing chamber 100 for processing, a voltage power is supplied to the sputtering source 114 (e.g., target) to sputter material that forms a first portion of the metal containing layer 402. For example, voltage power supplied to an Al target sputters the metal Al source material from the sputtering source 114 in form of aluminum ions, such as $Al^{3+}$ that form the first portion of the metal layer 402. The bias power applied between the sputtering source 114 and the pedestal 108 maintains a plasma formed from the gas mixture in the process chamber 100. The ions mainly from the gas mixture in the plasma bombard and sputter off material from the sputtering source 114. The gas mixture and/or other process parameters may be varied during the sputtering deposition process, creating a gradient with desired film properties for different film quality requirements.

During processing, several process parameters may be regulated. In one embodiment, the DC or RF source power may be supplied between about 100 Watts and about 20000 Watts. A RF bias power may be applied to the substrate support between about 50 Watts and about 5000 Watts.

At operation 308 and after the first portion of the metal containing layer 402 has been deposited, the substrate 101 may be rotated to assist forming a second portion of the metal containing layer 402 on the first portion of the metal containing layer 402. In one example, the substrate 101 may be rotated on the pedestal 108 in-situ the processing chamber while the substrate is exposed to plasma or during a period where the plasma has been extinguished. The substrate 101 is biased while forming the plasma from the deposition gas mixture at operation 306. The support pedestal 108 may be rotated continuously or periodically during deposition of the metal containing layer 402 on the substrate 101. In one embodiment, the pedestal 108 may rotate about the axis 147 between about 1° and about 360°, such as between about 30° and about 270°, for example, between about 90° and about 180°. The support pedestal 108 may be rotated about between 0 rpm and about 100 rpm until a desired thickness of the metal containing layer 402 is formed on the substrate 101, as shown in FIG. 4B.

In one example, the substrate 101 may be rotated counterclockwise or clockwise on the pedestal 108 about 90° or 180° for each rotation. Between each rotation, the gas mixture and the power at operation 304 and operation 306 respectively may be continuously supplied or intermittently suspended until the substrate rotation is completed and the substrate orientation is in a desired orientation so that the deposition process can then be resumed. The substrate 101 may be rotated for one time or multiple times as needed during the deposition process (while performing the operation 304, 306) until the desired thickness of the metal containing layer 402 is formed on the substrate 101. In one example, the substrate 101 may be rotated for about 180° when about 50% of the total predetermined process time is performed. The frequency of the rotation may be saved as part of the recipe in the controller 198 in the processing chamber 100. In one particular example, the substrate 101 is rotated about 90 degrees when a thickness of about 25% of the total thickness of the metal containing layer 402 is reached. Alternatively, the pedestal 108 may be continuously rotated during the deposition process as needed to deposit the metal containing layer 402 on the substrate 101 while rotating the substrate 101.

In another example, the substrate 101 may be rotated ex-situ the processing chamber in which the metal containing layer 402 is deposited. For example, the rotation of the substrate 101 may be performed in an orientation chamber, such as the processing chamber 211 or the chambers 232, 228, 220, ex-situ from (e.g., in a different chamber than) the processing chamber 100, that is also incorporated in the cluster processing system 200. Alternatively, the substrate 101 may be rotated by the robot 230 disposed in the transfer chamber 236 as needed. During the deposition process, the substrate 101 may be transferred to the orientation chamber to change the rotational orientation of the substrate. While placing the substrate 101 on the orientation chamber for substrate rotation, additional treatment processes may be performed on the substrate surface, as needed, to assist altering the film properties of the metal containing layer 402 formed on the substrate 101. For example, an additional heating process, cooling process, surface modification processes (e.g., surface treatment process, plasma modification process, plasma immersion process, dopant incorporation process, or the like) may be performed while the substrate 101 is placed in the orientation chamber prior to, during, or after the substrate rotation. Thus, a surface treatment process may be performed on the substrate 101 when the substrate 101 is placed in the orientation chamber. By doing so, the metal containing layer 402 formed on the substrate 101 may be treated prior to, during, or after the substrate rotation. After the substrate rotation and/or orientation change, the substrate 101 may be then transferred back to the processing chamber 100 to resume the deposition process, until a desired thickness of the metal containing layer 402 is reached.

It is believed that the additional process performed on the orientation chamber prior to, during, or after the substrate rotation enables film property alternation (e.g., homogenization of the grain and/or the bonding structures) after the substrate 101 has been removed from the processing chamber 100. Thus, the film properties of the metal containing layer 402 may be further altered, adjusted or enhanced while positioning in the orientation chamber so as to enhance process efficiency and manufacturing cycle time.

In one example, a temperature controlling mechanism, such as heaters, plasma generator, cooling water system, or other suitable systems, may be utilized to assist performing the surface treatment on the substrate when placing in the orientation chamber for substrate rotation.

By performing the substrate rotation in an orientation chamber, rather than on the pedestal 108 in the processing chamber 100, the selection and/or configuration of the processing chamber 100 to perform the deposition process may be relatively simple so that complex selection and/or installation of rotatable substrate pedestal in the processing chamber may be avoided. Furthermore, an additional process may be performed in the orientation chamber or other chambers when the substrate 101 is removed from the processing chamber 100 so that the metal containing layer 402 may be further agitated, excited or activated by different processes to achieve certain film property requirement as needed.

As discussed above, after the substrate rotation, the substrate 101 is then transferred back to the processing chamber 100 to resume the deposition process until a desired thickness of the metal containing layer 402 is formed on the substrate 101. Transfer of the substrate 101 between the processing chamber 100 and the orientation chamber may occur as many times as needed based on the desired resultant film properties and thickness requirements.

At operation 310, after one or more of the substrate rotation processes, the metal containing layer 402 is formed on the substrate 101 with desired film thickness and uniformity. In one example, the metal containing layer 402 has a thickness between about 200 nm and about 2000 nm. The film uniformity may be controlled less than 0.8%, such as at between about 0.2% and about 0.7%. Furthermore, the film uniformity of the metal containing layer 402 is believed to be reduced (i.e., improved) by about 0.3% and about 0.4% as compared to a metal containing layer formed without substrate rotation. In addition, as the substrate uniformity is improved, the stress profile across the substrate is also beneficially more uniform and more symmetrically distributed. In one example, the stress deviation across the metal containing layer 402 is controlled to be less than 200 MPa. The metal containing layer 402 is believed to have a stress reduction for about between about 20% and about 30% as compared to the metal containing layer without substrate rotation during deposition.

Thus, methods for forming a metal containing layer on a substrate is provided. The deposition process may include depositing the metal containing layer while changing the substrate orientation during the deposition process. The substrate may be rotated in the processing chamber where the deposition process is performed or in an orientation chamber separate from the processing chamber. By utilizing substrate rotation during deposition, the metal containing layer formed on the substrate may have a relatively more uniform film uniformity as well as stress profile across the substrate.

While the foregoing is directed to embodiments of the present disclosure, other and further embodiments of the disclosure may be devised without departing from the basic scope thereof, and the scope thereof is determined by the claims that follow.

What is claimed is:

1. A method of sputter depositing a metal containing layer on a substrate, comprising:
   supplying a gas mixture into a processing chamber;
   forming a first portion of a metal containing layer on a substrate;
   transferring the substrate from the processing chamber;
   rotating the substrate outside of the processing chamber;
   transferring the substrate back to the processing chamber; and
   forming a second portion of the metal containing layer on the first portion of the metal containing layer.

2. The method of claim 1, further comprising:
   performing a surface treatment process on the substrate.

3. The method of claim 2, wherein the substrate is rotated between about between about 30° and about 270°.

4. The method of claim 2, wherein the substrate is rotated about 90° or about 180°.

5. The method of claim 2, further comprising:
   rotating the substrate on a support pedestal located outside of the processing chamber.

6. The method of claim 2, wherein the substrate is rotated by a robot retrieving the substrate from the processing chamber.

7. The method of claim 1, further comprising:
   transferring the substrate to an orientation chamber; and
   rotating the substrate in the orientation chamber.

8. The method of claim 7, wherein the orientation chamber and the processing chamber are incorporated in a cluster processing system.

9. The method of claim 7 further comprising:
   performing a surface treatment process on the substrate in the orientation chamber.

10. The method of claim 9, wherein the surface treatment process alters a film property of the metal containing layer.

11. The method of claim 7, further comprising:
    transferring the substrate back to the processing chamber to confine continue forming the second portion of the metal containing layer; and
    transferring the substrate to the orientation chamber for additional substrate rotation.

12. The method of claim 1, further comprising:
    fabricating a target disposed within the processing chamber from at least one of Al, Ti, Ta, W, Cr, Ni, Cu, Co, Nb, Zr, Sc, alloys thereof, or combinations thereof.

13. The method of claim 1, further comprising:
    fabricating a target disposed within the processing chamber from Al.

14. The method of claim 1, wherein the metal containing layer is AlO, AlN, ScAlN, AlON, lead zirconate titanate, lithium niobate or potassium sodium niobate.

15. The method of claim 1, wherein the metal containing layer has a stress deviation less than 200 MPa.

16. A computer-readable storage medium storing a program, which, when executed by a processor performs an operation for operating a processing chamber, the operation comprising:

performing a deposition process in a processing chamber to form a first portion of a metal containing layer on a substrate;
removing the substrate from the processing chamber;
rotating the substrate; and
transferring the substrate back in the processing chamber to deposit a second portion of the metal containing layer.

17. The computer-readable storage medium of claim 16, further comprising:
performing a surface treatment process while rotating the substrate.

18. The computer-readable storage medium of claim 16, further comprising:
rotating the substrate is between about between about 30° and about 270°.

19. The computer-readable storage medium of claim 16, further comprising:
rotating the substrate on a support pedestal located outside of the processing chamber, wherein the substrate is rotated about 90° or about 180°.

20. The computer-readable storage medium of claim 16, further comprising:
transferring the substrate to an orientation chamber; and
rotating the substrate in the orientation chamber.

* * * * *

UNITED STATES PATENT AND TRADEMARK OFFICE
CERTIFICATE OF CORRECTION

PATENT NO. : 11,170,998 B2  
APPLICATION NO. : 16/811901  
DATED : November 9, 2021  
INVENTOR(S) : Lizhong Sun et al.

Page 1 of 1

It is certified that error appears in the above-identified patent and that said Letters Patent is hereby corrected as shown below:

In the Specification

In Column 3, Line 7, delete "FIG." and insert -- FIGS. --, therefor.

In the Claims

In Column 12, Line 48, in Claim 11, before "continue" delete "confine".

In Column 12, Line 60, in Claim 14, delete "AIO, AIN," and insert -- AlO, AlN, --, therefor.

In Column 12, Line 60, in Claim 14, delete "ScAIN, AION," and insert -- ScAlN, AlON, --, therefor.

Signed and Sealed this  
Eighth Day of March, 2022

Drew Hirshfeld  
*Performing the Functions and Duties of the*  
*Under Secretary of Commerce for Intellectual Property and*  
*Director of the United States Patent and Trademark Office*